United States Patent [19]

Martin

[11] Patent Number: 5,412,247
[45] Date of Patent: May 2, 1995

[54] PROTECTION AND PACKAGING SYSTEM FOR SEMICONDUCTOR DEVICES

[75] Inventor: Jacob Martin, Wellesley, Mass.

[73] Assignee: The Charles Stark Draper Laboratory, Inc., Cambridge, Mass.

[21] Appl. No.: 649,219

[22] Filed: Jan. 25, 1991

Related U.S. Application Data

[63] Continuation of Ser. No. 386,352, Jul. 28, 1989, abandoned.

[51] Int. Cl.⁶ ............................................. H01L 23/02
[52] U.S. Cl. .................................. 257/678; 257/684; 257/701; 257/710; 257/704
[58] Field of Search .................. 357/74, 72, 80; 257/678, 684, 701, 704, 710

[56] References Cited

U.S. PATENT DOCUMENTS

| | | | |
|---|---|---|---|
| 4,063,349 | 12/1977 | Passler et al. | 29/627 |
| 4,276,558 | 6/1981 | Ho et al. | 357/74 |
| 4,608,592 | 8/1986 | Miyamoto | 357/74 |
| 4,695,870 | 9/1987 | Patraw | 357/74 |
| 4,727,410 | 2/1988 | Higgins, III | 357/74 |
| 4,745,455 | 5/1988 | Glascock, II et al. | 357/74 |
| 4,839,717 | 6/1989 | Phy et al. | 357/74 |
| 4,868,712 | 9/1989 | Woodman | 361/388 |
| 4,890,157 | 12/1989 | Wilson | 357/80 |
| 4,899,208 | 2/1990 | Dietsch et al. | 357/74 |
| 4,901,136 | 2/1990 | Neugebauer et al. | 357/80 |
| 4,905,075 | 2/1990 | Temple et al. | 357/74 |
| 4,907,065 | 3/1990 | Sahakian | 357/74 |
| 4,931,853 | 6/1990 | Ohuchi et al. | 357/74 |
| 5,016,085 | 5/1991 | Hubbard et al. | 357/80 |
| 5,018,002 | 5/1991 | Neugebauer et al. | 357/74 |

FOREIGN PATENT DOCUMENTS 59-186348 10/1984 Japan .

Primary Examiner—Viet Q. Nguyen
Attorney, Agent, or Firm—Iandiorio & Teska

[57] ABSTRACT

A protection and packaging system for a semiconductor circuit having a first planar surface and an active region on at least a portion of the planar surface. An adhesive securely bonds a protective member directly to the first planar surface for generally protecting and hermetically sealing at least the active region of the semiconductor circuit. The protective member has a coefficient of thermal expansion which matches or closely matches that of the semiconductor device. The protective member may include an electrically conductive member and may have one or more openings. Individual electrically conductive members distribute power and ground to the active region of the circuit through bonding wires and contact pads located within the openings.

21 Claims, 2 Drawing Sheets

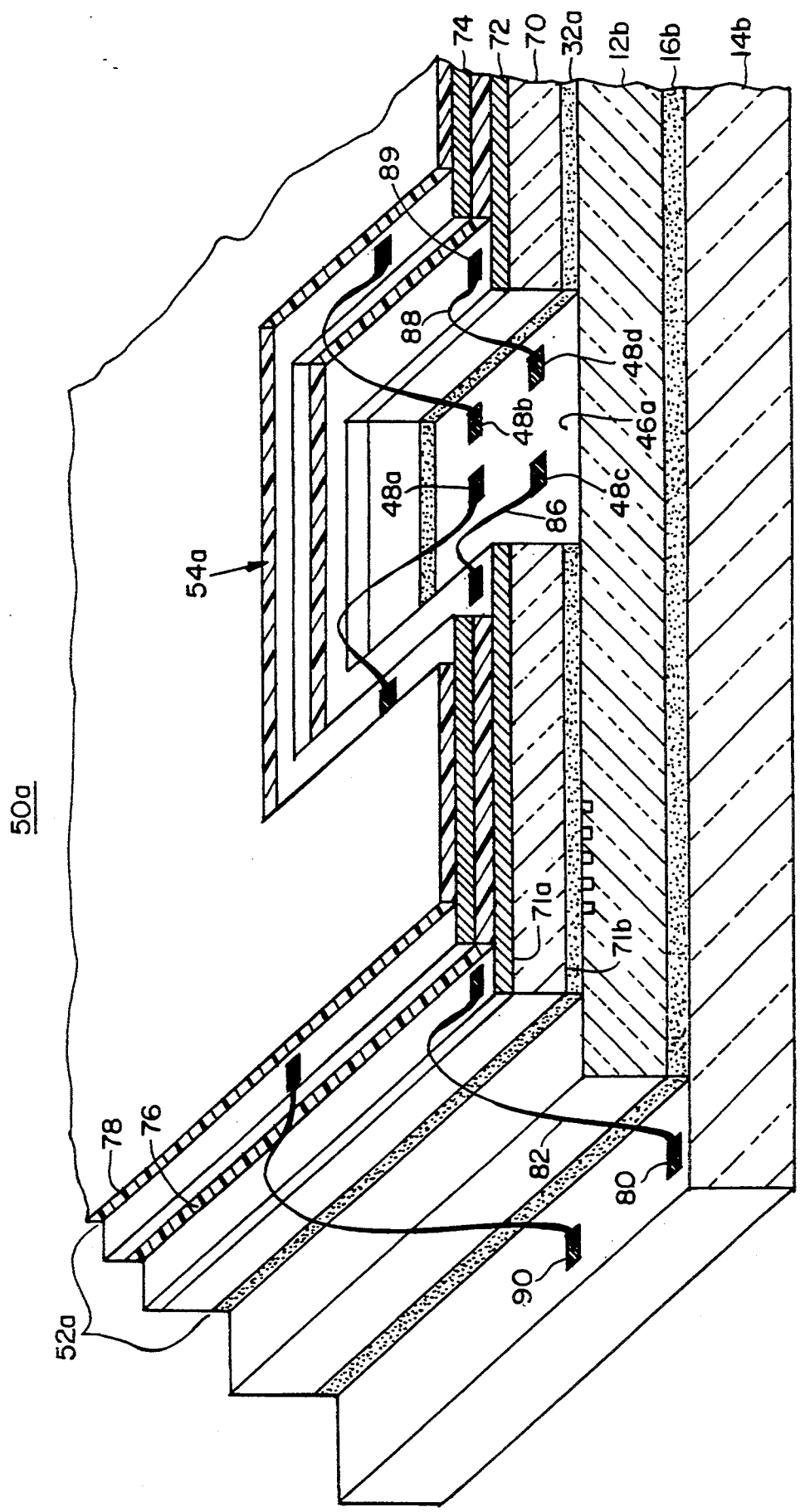

PROTECTION AND PACKAGING SYSTEM FOR SEMICONDUCTOR DEVICES

This is a continuation of application Ser. No. 07/386,352, filed Jul. 28, 1989, abandoned.

FIELD OF INVENTION

This invention relates to a system for packaging semiconductor devices, and more particularly, to a system for protecting and sealing at least the active region of a semiconductor device with a cover which is hermetically impermeable and which closely matches the coefficient of thermal expansion of the semiconductor material.

BACKGROUND OF INVENTION

The continued development of physically larger, more complex and higher power semiconductor devices is focusing much attention on the need to package these electronic circuits to provide physical as well as hermetic protection. In addition, the package must help maintain the operating temperature of these devices at a point where their reliability is at an acceptable level. Further, new semiconductor devices may consume hundreds to thousands of watts of power, necessitating the development of new methods of providing power to the circuit, and further increasing the requirement for removing the heat generated by these new higher power devices.

Due to the large variations in the operating temperature or operating environment of the devices, there must not be any large thermal mismatches between the semiconductor device and the packaging materials. This is a critical concern since any thermal mismatch between the semiconductor device and its packaging may induce stresses which can cause a failure in the device itself or in its attachment to the package.

Although the semiconductor devices are becoming larger in size, the interconnections or traces between the logic elements that make up the semiconductor device have become smaller. These traces may be as narrow as one micron wide or less, making them very susceptible to corrosion from moisture or gases in a hostile environment. Intended uses for these larger semiconductor devices still require that they be protected and packaged in such a manner that they be hermetically sealed as well as coolable.

Present semiconductor packaging techniques generally require that a cavity be left surrounding the circuit die itself. Applications requiring hermetic sealing of the semiconductor device require that the package be hermetically tested at levels both higher and lower than atmospheric pressure to insure that no contaminants can enter the cavity surrounding the die. As the circuit becomes larger in size, both the package size and the lid or cover increase in size to accommodate the larger circuit and its interface pads or pins. The increase in area of the lid or cover requires that it be made thicker to reduce deflection under differential pressure. In addition, since the cover is bonded only around its periphery, the stress on the peripheral bond increases with an increase in cover size which could open the bond or damage feed-throughs in the peripheral wall.

SUMMARY OF INVENTION

It is therefore an object of this invention to provide a protection and packaging system for a semiconductor device which hermetically protects at least the active area of the semiconductor circuit.

It is a further object of this invention to provide a protection and packaging system which eliminates the requirement of hermetic testing.

It is still further object of this invention to provide a protection and packaging system which is light-weight.

It is a further object of this invention to provide such a protection and packaging system which is inexpensive and easy to manufacture.

It is a still further object of this invention to provide a protection and packaging system for a semiconductor device which closely matches the coefficient of thermal expansion of the package to that of the semiconductor device.

It is a further object of this invention to provide such a packaging system which is thermally conductive.

It is a further object of this invention to provide such a protection and packaging system which facilitates the distribution of electrical energy, necessary to power the electronic circuit, over the active area of the electronic device.

This invention results from the realization that a truly effective system for protecting and packaging a large area semiconductor device can be achieved by directly bonding to the active area of semiconductor circuit, a protective member which is hermetically impermeable and which has a coefficient of thermal expansion which closely matches that of the semiconductor device. This invention results from the further realization that the protective member may be utilized to distribute electrical energy necessary to power the device, over the active area of the semiconductor device.

This invention features a protection and packaging system for a semiconductor circuit having a first planar surface and an active region on at least a portion of the surface. A protective member is disposed on the first planar surface and covers at least the active region of the semiconductor circuit. Adhesive means securely bond the protective member to the surface for generally sealing and protecting the active region of the semiconductor circuit.

In a preferred embodiment, the protective member is hermetically impermeable. In addition, at least a portion of the surface of the protective member adjacent to the active region of the semiconductor circuit may be electrically insulative. Alternatively, the adhesive means may provide electrical insulation and may include glass or an organic material. Further, the adhesive means may be thermally conductive and may form a generally hermetic seal between the protective member and the semiconductor circuit.

The protective member has a coefficient of thermal expansion which matches or closely matches that of the semiconductor circuit, and may be selected from the group including silicon, aluminum nitride, silicon carbide, gallium arsenide, alumina, and a carbon/metal composite material. In addition, the protective member may be thermally conductive.

The protective member may also include at least one electrically conductive member. The electrically conductive member may conduct and distribute electrical energy to electrical contact pads on the semiconductor circuit. The protective member may also include open regions for allowing electrical connection between the electrically conductive member and the electrical contact pads interposed within the active region of the semiconductor circuit.

DESCRIPTION OF PREFERRED EMBODIMENT

Other objects, features and advantages will occur from the following description of preferred embodiments and the accompanying drawings, in which:

FIG. 3 is a detailed cross sectional view of the protection and packing system shown in FIG. 2.

A protection and packaging system for a semiconductor device according to this invention, may be accomplished using a protective member disposed on a first major planar surface of a semiconductor device having an active region on at least a portion of the planar surface. The protective member covers at least the active region of the semiconductor device. In addition, adhesive means securely bond the protective member to the first major planar surface for generally protecting the active region of the semiconductor device. Typically, the protective member is hermetically impermeable and electrically insulative on at least the surface adjacent to the active region of the semiconductor device. In the case where the semiconductor device is made from silicon, the protective member may be made from materials including silicon, aluminum nitride, silicon carbide materials, and a carbon/metal composite material or other material with a closely matching coefficient of thermal expansion. In such case where the semiconductor device is made from gallium arsenide, the protective member may be made from gallium arsenide, aluminum, carbon/metal composite material or other material with a closely matching coefficient of thermal expansion. Such a carbon/metal composite material is disclosed in my patent application Ser. No. 07/353,086, which is herein incorporated by reference. If the protective member is electrically conductive, a thin electrically insulative layer may be added to the surface which will be placed adjacent to the semiconductor. Alternatively, the adhesive may be relied upon to provide electrical insulation. Most importantly, the protective member has a coefficient of thermal expansion which matches or closely matches that of the semiconductor material. Further, the protective member is thermally conductive to enable heat transfer from the circuit to a heat sink adjacent to the cover as well as through the base as conventionally accomplished.

Although the protective member may include at least one surface which has been treated or to which has been applied an electrically insulative layer, the adhesive means generally is an electrically insulative and impermeable material such as phosphorous silicon glass or a devitrifiable glass, or an organic adhesive from groups such as silicones, epoxies, and acrylics. It is desirable that the adhesive be a good adhesive containing a minimum amount of impurities and not absorb moisture to any great degree. In addition, the adhesive means forms a low permeability seal between the protective member and the semiconductor device by virtue of its favorable geometry of small exposed area.

Figure 1:
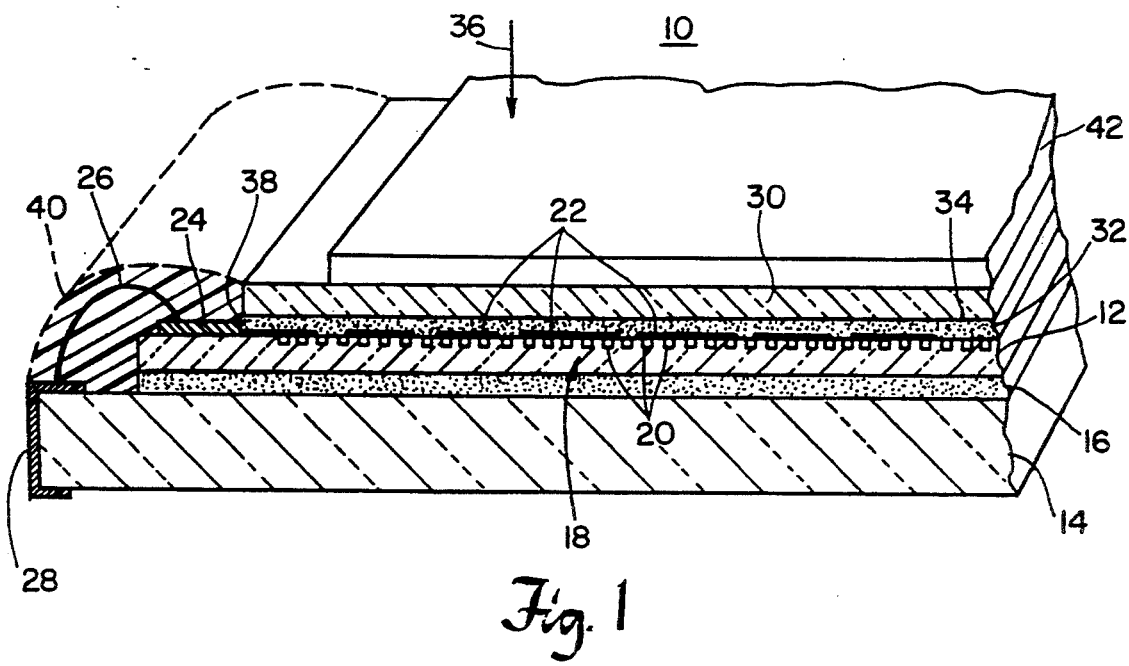
FIG. 1 is a cross sectional view of a semiconductor device incorporating the protection and packaging system according to this invention.

A protection and packaging system 10, FIG. 1, for a semiconductor device includes semiconductor circuit wafer 12 bonded to base 14 by means of conventional thermally conductive adhesive layer 16. Circuit wafer 12 includes active region 18 having a plurality of doped channels 20 connected by traces 22. Traces 22 may extend to bonding pad 24. Bonding wire 26 forms an electrical connection between bonding pad 24 and carrier interface pad 28.

Protective member 30 is disposed over active region 18 of circuit wafer 12. Adhesive 32 bonds protective member 30 to circuit wafer 12. Although adhesive 32 is electrically insulative, lower surface 34 of protective member 30 which is adjacent to active region 18 of circuit wafer 12 may also be insulative. This insulative surface may be developed by oxidizing or anodizing surface 34 of protective member 30 or by providing a layer of insulative carbon/metal composite or an organic material.

Protective member 30 is generally hermetically impermeable, and covers active region 18 of circuit wafer 12. Hermetic protection is afforded to active region 18 of circuit wafer 12 from corrosive substances entering in the direction of arrow 36. Exposed adhesive edge 38 formed between protective member 30 and circuit wafer 12 has a very small cross section and a long diffusion path exists to active region 18. This favorable geometry affords a degree of hermetic protection to circuit wafer 12. Bonding pad 24 is much larger in size and may be a less reactive material than traces 22, and therefore is less susceptible to failure by corrosion. Enclosure 40 may be an organic material such as silicones, epoxies, acrylics, or another suitable substance and may be applied to protect and seal bonding pad 24, bonding wire 26, and edge 38, thus providing protection for the bonding pads and wires. In addition, heat sink 42 may be adjacent or bonded to protective member 30 to enable heat transfer from circuit wafer 12 through heat sink 42 as well as through a heat sink adjacent or bonded to base 14. Further, since protective member 30 is made from silicon or other suitable material which matches or closely matches the coefficient of thermal expansion of base 14, thermal stresses are minimized.

Figure 2:
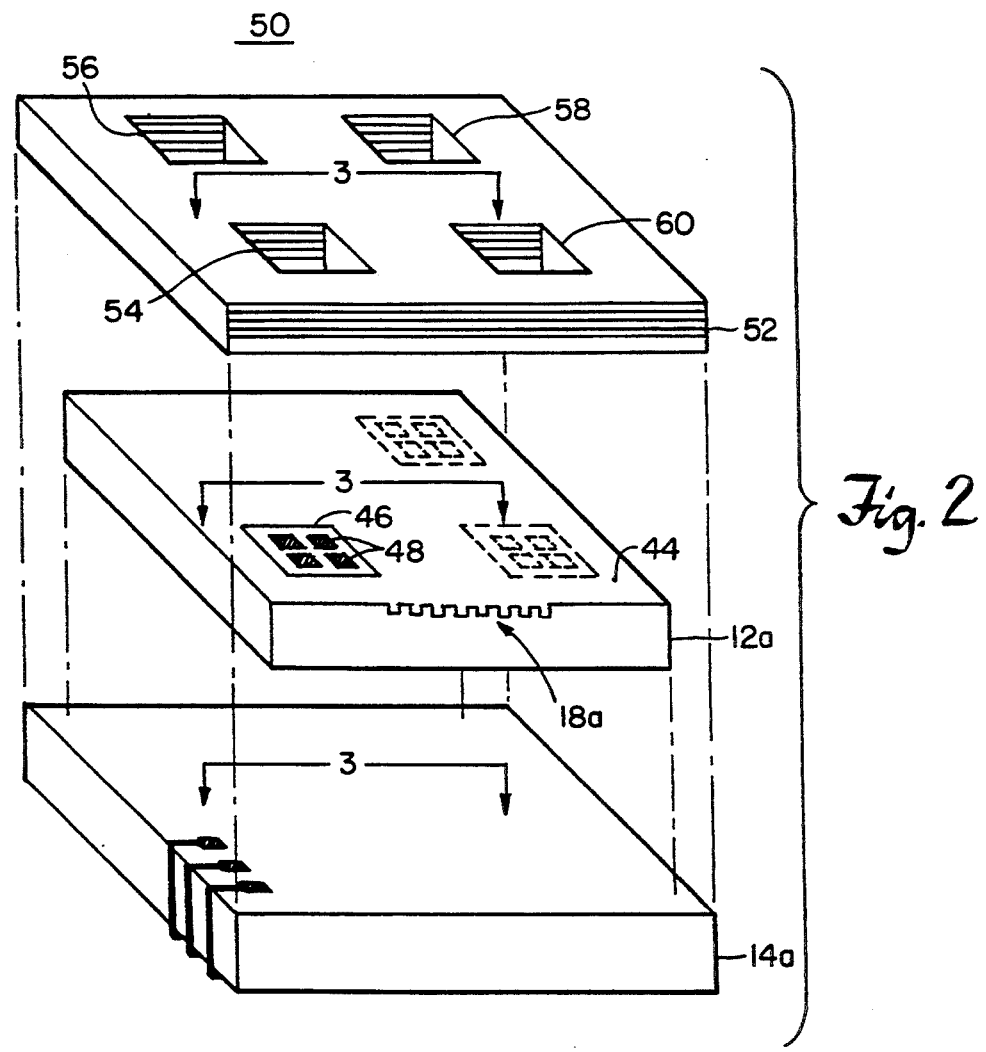
FIG. 2 is an exploded view of an alternative embodiment of the protection and packaging system according to this invention including a multi-layer protective cover with apertures adapted for providing power distribution to the active area of the semiconductor device.

Another embodiment of the protection and packaging system for semiconductor devices 50, FIG. 2, includes base 14a on which is mounted semiconductor wafer 12a having active region 18a on at least a portion of its upper surface 44. Also included on upper surface 44 of semiconductor wafer 12a is one or more interior regions 46 having one or more contact or bonding pads 48.

Protective member 52 is a layered structure, and is adapted to be bonded or laminated to upper surface 44 of semiconductor wafer 12a. Included within protective member 52 are one or more openings 54–60. Once protective member 52 is laminated to semiconductor wafer 12a, the openings allow access to area 46 on circuit wafer 12a, which contains bonding pads 48. Openings 54–60 may remain as open areas or may later be filled with sealing material such as an organic material or other suitable material. A heat sink may be positioned over protective member 52 to help transfer heat from circuit wafer 12a to a heat dissipating device or may itself be a heat exchanger.

As shown after assembly, protection and packaging system 50a, FIG. 3, includes circuit wafer 12b laminated to base 14b by means of adhesive 16b. Layered protective member 52a is adhered to circuit wafer 12b by means of adhesive layer 32a.

Opening 54a exposes circuit interior region 46a on which are located bonding pads 48a–48d. Layered protective member 52a includes layers. 70, 72 and 74. The layers are separated by insulative bonding layers 76 and 78, such as polyimide.

First layer 70 is the primary protective layer and may include silicon which has been oxidized on surfaces 71a and 71b to render these surfaces insulative. Second and third layers 72 and 74 respectively, are electrically conductive members and are adapted to distribute electrical power to various areas of the active surface of semiconductor wafer 12b. The second and-third layers may include metal such as aluminum or copper. The layers may be a continuous metalization layer or discrete and separate metalized strips for providing discrete voltages. For example, semiconductor wafer connector pin 80 may be connected to a power supply return through a printed circuit board interconnection. Bonding wire 82 connects connector pin 80 with second layer 72. Similarly, bonding wire 86 located within opening 54a connects circuit bonding pad 48c with second layer 72. Thus, electric current is allowed to return from the semiconductor circuit to the power supply by flowing through bonding wire 86, second layer 72, and subsequently exiting the semiconductor circuit by means of connector pin 80. Therefore, second layer 72 is used as a ground plane for the entire semiconductor circuit. Additional connections with second layer 72 may be made such as through bonding pad 48d, bonding wire 88 and bonding pad 89.

In a similar manner, connector pin 90 may be connected to a power supply source such as a +5 V. Third layer 74 then serves as a distribution plane for +5 V over the entire active region of the semiconductor circuit at preselected points such as circuit bonding pads 48a and 48b. Insulative layer 76 serves as an insulative layer between ground layer 72 and power layer 74. Distributing power and ground to the wafer utilizing layers in the protective member also serves the added benefit of providing very high-frequency decoupling capacitance between the supply voltage(s) and ground.

Although specific features of the invention are shown in some drawings and not in others, this is for convenience only as each feature may be combined with any or all of the other features in accordance with the invention.

Other embodiments will occur to those skilled in the art and are within the following claims:

What is claimed is:

1. A protection and packaging system for a semiconductor circuit with a planar surface having an active region thereon, comprising:
    a flat, hermetically impermeable protective member at least as large as the semiconductor circuit active region having an electrically insulative surface for entirely covering and sealing the region; and
    an adhesive substance entirely covering the semiconductor circuit active region for securely bonding said protective member directly to the semiconductor circuit active region to seal, protect and package the active region.

2. A thermally matched and sealed protection and packaging system for a semiconductor circuit having a predetermined coefficient of thermal expansion and with a planar surface having an active region thereon, comprising:
    a flat, hermetically impermeable protective member at least as large as the semiconductor circuit active region having an electrically insulative surface for entirely covering and sealing the region, said protective member having a coefficient of thermal expansion the same as or closely matching that of the semiconductor circuit; and
    an adhesive substance entirely covering the semiconductor circuit active region for securely bonding said protective member directly to the semiconductor circuit active region to seal, protect and package the active region.

3. An electronic circuit packaging and protection assembly for an electronic circuit with a planar surface having an active region thereon and a plurality of electrical contact pads within the active region, comprising:
    a multiple-layer, flat, hermetically impermeable protective member at least as large as the electronic circuit active region having an electrically insulative surface for covering and sealing at least a portion of the active region, said protective member including a partially electrically conductive layer and at least one opening therein for exposing at least some of the contact pads to allow electrical connection between at least one of the exposed pads and said partially electrically conductive layer; and
    an adhesive substance entirely covering the portion of the electronic circuit active region to be sealed by said protective member, for securely bonding said protective member to the electronic circuit active region to be sealed to seal, protect and package the active region.

4. The system of claim 1 further including edge sealing means for sealing and protecting the periphery of said semiconductor circuit.

5. The system of claim 2 in which said edge sealing means includes an organic material.

6. The system of claim 1 in which said protective member has a coefficient of thermal expansion which matches or closely matches that of said semiconductor circuit.

7. The system of claim 6 in which said semiconductor circuit and said protective member include silicon.

8. The system of claim 6 in which said semiconductor circuit and said protective member include gallium arsenide.

9. The system of claim 1 in which said protective member is selected from the group containing silicon, aluminum nitride, silicon carbide, gallium arsenide, alumina and a carbon/metal composite material.

10. The system of claim 1 in which said protective member is thermally conductive.

11. The system of claim 1 in which at least one surface of said protective member is electrically insulative.

12. The system of claim 11 in which said protective member is made of electrically insulative material.

13. The system of claim 11 in which said electrically insulative surface is adjacent to the active region of the semiconductor circuit.

14. A system of claim 1 in which said adhesive substance includes glass or an organic adhesive.

15. A system of claim 1 in which said adhesive substance and said protective member form a low-permeability seal for said semiconductor circuit.

16. The system of claim 2 further including edge sealing means for sealing and protecting the periphery of said semiconductor circuit.

17. The system of claim 16 in which said edge sealing means includes an organic material.

18. The assembly of claim 3 in which said protective member has a coefficient of thermal expansion which matches or closely matches that of said electronic circuit.

19. The assembly of claim 3 in which said protective member includes silicon.

20. The assembly of claim 3 in which said adhesive means is electrically insulative and thermally conductive.

21. The assembly of claim 3 in which said protective member includes at least two at least partially electrically conductive layers separated by an insulaing layer, all bonded together, for allowing electrical connection between the exposed pads and both said conductive layers.

* * * * *